United States Patent [19]

Chang et al.

[11] Patent Number: 6,018,623
[45] Date of Patent: Jan. 25, 2000

[54] METHOD AND SYSTEM FOR DETERMINING STATISTICALLY BASED WORST-CASE ON-CHIP INTERCONNECT DELAY AND CROSSTALK

[75] Inventors: Norman H. Chang, Fremont; Valery Kanevsky, Los Gatos; O. Sam Nakagawa, Redwood City; Soo-Young Oh, Fremont, all of Calif.

[73] Assignee: Hewlett-Packard Company, Palo Alto, Calif.

[21] Appl. No.: 08/949,048

[22] Filed: Oct. 10, 1997

[51] Int. Cl.[7] ................................................. G06F 17/50
[52] U.S. Cl. .............................. 395/500.07; 395/500.23; 395/500.4
[58] Field of Search ............................ 364/468, 488, 364/489, 490, 491, 578; 395/500.03, 500.05, 500.06, 500.07, 500.11, 500.12, 500.15, 500.4, 500.34, 500.35, 500.36, 500.23

[56] References Cited

U.S. PATENT DOCUMENTS

| | | | |
|---|---|---|---|
| 4,105,958 | 8/1978 | Pierce et al. | 333/29 |
| 5,301,118 | 4/1994 | Heck et al. | 364/468 |
| 5,305,229 | 4/1994 | Dhar | 364/489 |
| 5,365,463 | 11/1994 | Donath et al. | 364/578 |
| 5,379,232 | 1/1995 | Komoda | 364/489 |
| 5,610,833 | 3/1997 | Chang et al. | 364/491 |
| 5,761,080 | 6/1998 | DeCamp et al. | 364/490 |
| 5,828,580 | 11/1994 | Ho | 364/489 |

OTHER PUBLICATIONS

Liou "Semiconductor Device Physics and Modeling Part 2: Overview of Models and Their Applications," IEEE Proceedings of Circuits, Systems and Devices, p. 655–660, Dec. 1992.

Lugli "The Monte Carlo Method for Semiconductor Device and Process Modeling," IEEE Transactions on Computer–Aided Design of integrated Circuits and Systems, p. 1164–1176, Nov. 1990.

F.Y. Chang "Generation of 3–Sigma Circuit Models and Its Application to Statistical Worst–Case analysis of integrated Circuit Designs," Conference Record, 1977 11th Asilomar Conference on Circuits, Systems and Computers, p.29–34, Nov. 1977.

Hong and Allen "Performance Driven Analog Layout Compiler," 1990 IEEE International Symposium on Circuits and Systems, p.835–837, May, 1990.

K–J Chang et al. "HIVE: An Express and Accurate Interconnect Capacitance Extractor for Submicron Multilevel Conductor Systems," Proceedings, Eighth International IEEE VLSI Interconnection Conference, p. 359–363, Jun. 1991.

(List continued on next page.)

*Primary Examiner*—Kevin J. Teska
*Assistant Examiner*—Leigh Marie Garbowski

[57] ABSTRACT

A method and system of determining circuit performance-related characteristics, particularly delay and crosstalk, of interconnects includes defining a number of process variables which exhibit Gaussian distributions with respect to geometrical variances. A table of statistically based worst-case values representative of capacitances and resistances associated with different selections of the process variables is generated. In the preferred embodiment, the statistically based worst-case values are 3-sigma values. Also generated is a table of capacitance derivatives with respect to interconnect geometries. When a particular interconnect layout having selected process parameters is designated, the tables of 3-sigma values and derivatives are accessed to generate a resistance-capacitance (RC) net representative of the interconnect layout. The resistance and capacitance are correlated for each RC net and are partially determined by a randomized selection of values for geometries of the interconnect layout. The randomized selection of geometrical values is within the Gaussian distributions. Three-sigma delay and 3-sigma crosstalk may then be determined for the interconnect layout.

19 Claims, 3 Drawing Sheets

OTHER PUBLICATIONS

Gao et al. "Modeling and Simulation of Interconncection Delays and Crosstalks in high–Speed Integrated Circuits," IEEE Transactions on Circuits and Systems, vol. 37, No. 1, Jan. 1990.

Hanson et al. "Analysis of the Controllability of a Sub–Micron CMOS Process Using TCAD," 1994 international Symposium on Semiconductor Manufacturing, p. 85–89, Jun. 1994.

Moreira, Julio C. "Torque Ripple Minimization in Switched Reluctance Motors via Bi–Cubic Spline Interpolation," PESC '92 Record, 23rd Annual IEEE Power Electronics Specialists Conference, p. 851–856, Jul. 1992.

METHOD AND SYSTEM FOR DETERMINING STATISTICALLY BASED WORST-CASE ON-CHIP INTERCONNECT DELAY AND CROSSTALK

TECHNICAL FIELD

The invention relates generally to methods and systems for designing layouts of integrated circuits and more particularly to estimating resistance, capacitance, crosstalk and delay during an early floorplanning stage.

DESCRIPTION OF THE RELATED ART

Signal delay analysis plays an important role in the design of an integrated circuit chip layout. For example, within the design of a clock tree, the time difference between arrivals of a clock at different devices (i.e., clock skew) is important to proper operation of a circuit.

There are two main components of on-chip delay. The first component is logic gate delay, which is defined as the delay from the input of a gate to the output of the gate. The second component is on-chip interconnect delay, which is the delay from the beginning of a "wire" to the end of the wire.

Originally, the on-chip interconnect delay played a relatively small role in determining total delay along a circuit path. However, as integated circuit devices continue to decrease in size, the gate delay component shrinks. Thus, the interconnect delay component plays an increasingly larger role. It has been estimated that for deep submicron technologies (i.e., circuits with a minimum feature size of less than 0.5 μm) the on-chip interconnect delay can be more than 70% of the total delay.

In addition to delay, crosstalk is an issue in the design of interconnect structures for circuitry. As circuitry is increasingly miniaturized, neighboring interconnects are brought into closer proximity. As a result, undesired signal coupling among interconnects is increased.

Within the area of circuit design and layout, variations in on-chip interconnect delay and crosstalk will result from a number of different process variables that directly or indirectly relate to chip geometries. These variables may be categorized into the technological domain and the circuit domain. The technological domain relates to those performance-affecting process variables that are at least partially determined by inherencies of selected technologies for fabricating an integrated circuit. Thus, these factors are primarily under the control of a technology designer. The technological domain affects interconnect thickness, interlayer dielectric (ILD) thickness and a number of other quantities. New planarization processes, such as chemical metallization polishing (CMP), are utilized for deep submicron technologies and may cause more than 40% of the variation in ILD thickness within a yield of integrated circuit chips. Such processes have a significant impact on the chip-to-chip variations of interconnect capacitances. Variations in interconnect resistance (R) and capacitance (C) create variances in the circuit delay and crosstalk. If the circuit delay or interconnect crosstalk for a chip exceeds the specification of a critical circuit path on the chip, a circuitry failure will occur. Therefore, it is important to accurately estimate the circuit delay variances for purposes of performance and yield tuning.

Performance-affecting process variables within the circuit domain are ones that are within the control of a circuit layout designer. As examples, the thickness, length and width of an interconnect will affect resistance, and the spacing between interconnects will affect capacitance. Moreover, factors such as the underlying and overlying circuit density and the circuit layout orientation can cause CMP processing to create biased ILD thickness variations. This phenomenon may be referred to as a "feature-dependent effect" on the ILD thickness as a result of CMP processing.

Referring now to FIGS. 1 and 2, an exemplary interconnect model is shown as having three metallization layers. The interlayer dielectrics are not shown in the figures. The interconnect model includes an active array of three interconnects 10, 12 and 14 above an orthogonal metal array of interconnects 16, 18 and 20. Above the active array is a third array of interconnects 22, 24 and 26.

In FIG. 2, some of the capacitances and dimensions are identified. Ci is the coupled capacitance within the active array 10, 12 and 14; Cgd is the capacitance between the active array and the lower orthogonal array 16, 18 and 20; and Cgu is the capacitance between the active array and the upper orthogonal array 22, 24 and 26, given the material and process variations.

Process variables for which geometrical variances play a significant role in causing variations in capacitance are also indicated in FIG. 2. The variable h1 is a representation for the composition of the one or more dielectric layers between the active array and the lower passive orthogonal array. As previously noted, the h1 parameter may have a 40% variation in the dielectric thickness as a result of CMP planarization. The parameter h2 is representative of the composition of one or more dielectric layers between the active array and the upper orthogonal passive array. The thickness variation in each of the dielectrics in current practices can be up to 50%. The t parameter represents the thickness of the active interconnects 10, 12 and 14, which typically varies in the range of 5% to 30%. The parameter w represents the width of the active traces, which typically varies in the range of 10% to 30%. The parameter s is the spacing between active interconnects. Typically, the sum of w and s is a fixed interconnect-to-interconnect pitch in one sequence of routing within the active array, i.e., w+s=pitch. While not shown in FIGS. 1 and 2, Epsilon is the dielectric constant. Each dielectric in h1 and h2 has its own dielectric constant. However, the dielectric constants of most conventional dielectrics are substantially the same, other than the top coating layer and the top packaging layer. The variation in Epsilon is approximately 3%.

Systems and methods for investigating electrical characteristics of a multi-level interstructure are known. The process is complicated by the fact that adjacent interconnects sometimes follow non-parallel paths. Another complexity is that there is a non-linear relationship between some process variables and electrical characteristics. For example, the relationship between capacitance and the space between adjacent interconnects is non-linear. Consequently, the computation and simulation procedures are complex and are typically performed using electronic design automation (EDA) tools. For example, HIVE is a software package that performs 2D numerical field simulations for interconnects having given geometries to arrive at closest-fit analytical functions. As another example, SPICE is a software package that is commercially available for simulating electrical performance of complex Very Large Scale Integration (VLSI) chips. SPICE requires input in the form of a SPICE subcircuit data file, known in the art as a "SPICE deck" which numerically describes the value and type of every conductor and component of the VLSI chip.

U.S. Pat. No. 5,610,833 to Chang et al., which is assigned to the assignee of the present invention, describes a computer-aided design method for predicting electrical performance of multi-level interconnect structures. In the first step, a database is formed to store numerical capacitance values characteristic of various predefined interconnect geometries of semiconductor circuits. After an electrical performance criterion is defined for a desired semiconductor circuit, an interconnect layout for the circuit is designed and the database is used to select interconnect geometries that are similar to the geometries of the designed interconnect layout. Numerical capacitance values characteristic of the designed interconnect layout are then obtained by interpolating from selected interconnect geometries and their corresponding characteristic numerical capacitance values. From the interpolation step, it is determined whether the characteristic performance criterion will be met by the designed interconnect layout having the designed interconnect geometries. The method operates reasonably well for estimating interconnect delay, but further improvements are sought.

The known method and tools that account for geometrical variances resulting from fabrication processing often employ a skew-corner method in order to identify worst-case values. The worst-case values are determined for resistance (R) and capacitance (C). No correlation between R and C is established, so that the worst-case values for R and C are independently utilized in a simulation procedure. Again, the prior art techniques provide reasonable estimates, but further improvements are sought. It is also desirable to significantly decrease the required time for obtaining circuit simulation results. Known methods and tools may require days to output results.

What is needed is a method and system for determining accurate statistically based worst-case values of performance-related characteristics, such as interconnect delay and crosstalk, as a result of variations in interconnect-related process parameters.

SUMMARY OF THE INVENTION

A method of determining circuit performance-related characteristics of an interconnect layout for a circuit includes generating and storing statistically based worst-case values representative of capacitances and resistances associated with selections of process variables that exhibit fabrication-induced geometrical variances. The worst-case values are preferably 3-sigma resistance and capacitance values at an initial phase and 3-sigma delay and/or crosstalk values in a subsequent phase.

The process variables are either directly or indirectly related to interconnect geometries. The directly related variables include selections of the width and length of an interconnect and the spacing between adjacent interconnects. Indirectly related variables include selections among alternative techniques for executing a process step, such as the selection of chemical-mechanical polishing (CMP) as a planarization step. Different fabrication techniques often have different characteristics with respect to inducing geometrical variations that impact interconnect capacitance, delay and crosstalk. An accurate estimation of delay and crosstalk should consider a wide range of geometrical variances.

It has been determined that the process variables of interest typically exhibit Gaussian distributions of geometrical variances. In a first phase of the method, the 3-sigma values of capacitance and resistance and the partial derivatives of capacitance with respect to the process variables are generated and stored. The 3-sigma values of capacitance may be generated using weighted root-sum square techniques. The same techniques may be utilized to generate the 3-sigma values for resistance, but Monte-Carlo based simulation may be used as an alternative. In a multi-level interconnect structure, upper interlayer capacitive coupling and lower interlayer capacitive coupling must be considered in addition to the intralayer interconnect-to-interconnect capacitive coupling.

In a second phase, the stored tables of 3-sigma capacitance (C) and resistance (R) and the derivatives are utilized to generate resistance-capacitance (RC) nets representative of an interconnect layout of interest. The RC nets are formed of randomized, but correlated, R and C values. The correlated randomized R and C can be generated from nominal R and C for the selected interconnect layout and from partial derivatives of R and C with respect to process variables given Gaussian randomly generated geometrical values. An RC net is "randomized," since the geometrical values employed to determine the RC net are Gaussian randomly generated values. The RC net is "correlated," since the same Gaussian randomly generated process parameter values are used to acquire both C and per-unit R. The correlated R and C may be generated in a distributed 3-Pi network for the selected interconnect layout by utilizing a randomized RC generator.

In a final phase, the randomized RC nets are employed to determine worst-case values for one or both of delay and crosstalk. In the preferred embodiment, a device model is input, enabling estimation of delay and crosstalk for the entire circuit. The 3-sigma delay and crosstalk can be determined from a number of simulations, such as SPICE simulations or a fast delay calculator. The third phase may utilize weighted root-sum square techniques to combine the device and interconnect variations. This approach is reliable, since the device and interconnect variations arise independently in front-half and back-half processes. The 3-sigma crosstalk can be determined by identifying process corners for such geometrical parameters as interconnect width and thickness and the thicknesses of dielectric layers between interconnect arrays. The process corners for the selected interconnect layout may be matched with 3-sigma crosstalk calculated using Monte-Carlo based simulation. However, the time-consuming Monte-Carlo based simulations may be eliminated by setting the process corners for the dielectric thicknesses between interconnect layers to be equal to the nominal dielectric thickness plus slightly more than 1-sigma of the dielectric thicknesses. This practical method of skewing the variables can be used to estimate 3-sigma crosstalk of coupled signal nets during design or post-layout verification. Similarly, the method can be applied to find representative process corners for 3-sigma delay.

An advantage of the invention is that the statistically based method has been shown to provide significantly more accurate results than the traditional skew-corner method for determining worst-case delay in a critical net. It is believed that the primary reason for the improvement is that the present invention correlates R and C in the same net. The skew-corner method assumes no correlation between R and C, and therefore uses the worst-case values of R and C simultaneously within a simulation. Another advantage of the invention is that the statistically based method provides a significant reduction in the time required to determine delay and crosstalk for an interconnect layout.

DETAILED DESCRIPTION

Figure 3:
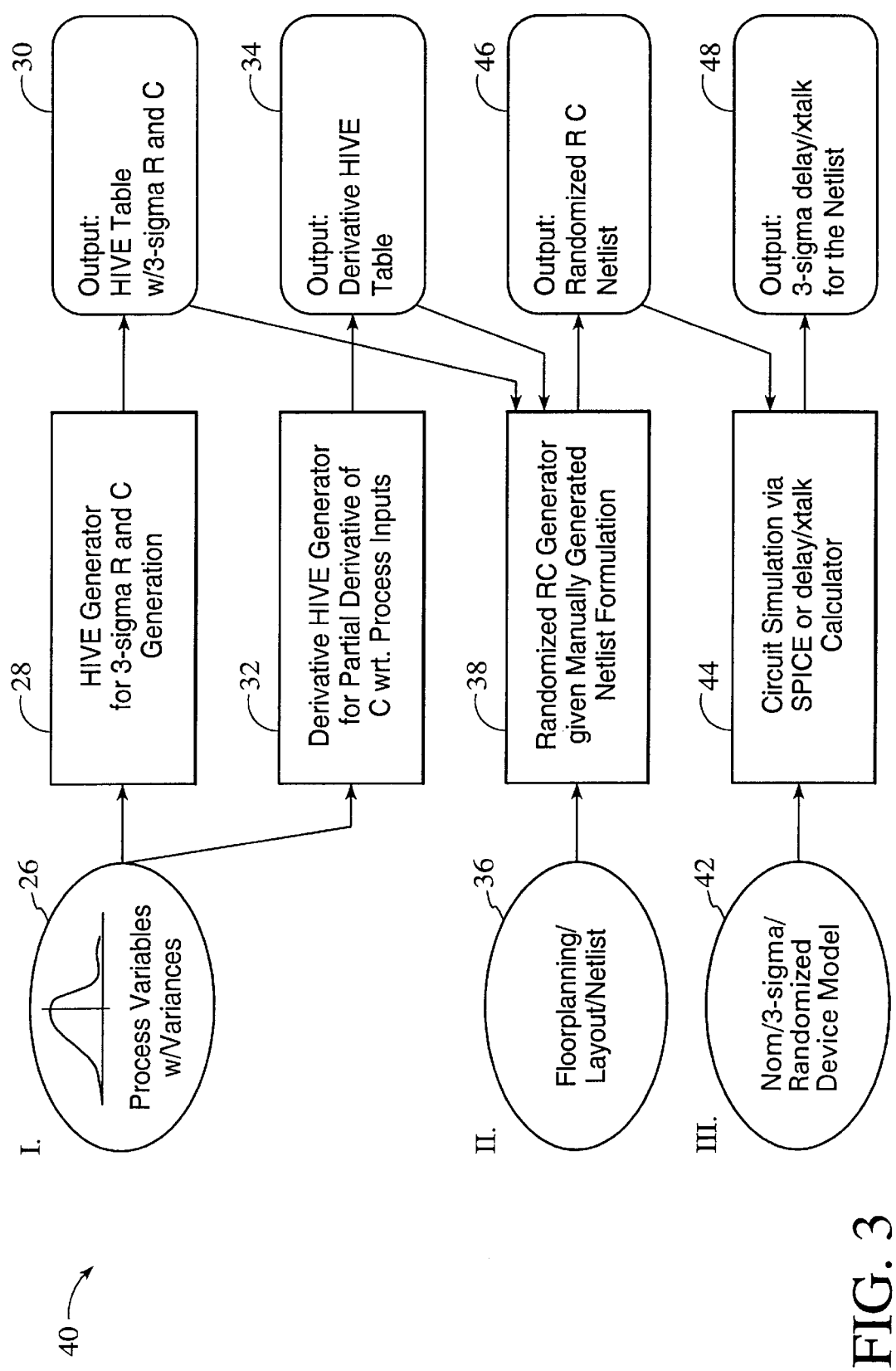
FIG. 3 is a schematical view of a system for implementing statistical modeling of interconnects and devices in accordance with the invention.

With reference to FIG. 3, the inputs and outputs for executing statistically based worst-case interconnect modeling in accordance with the invention are shown. Initially, the three phases of the method will be broadly described. A more detailed description will then follow. In the first phase, the inputs relate to process variables and geometrical variances for the process variables. An input device 26 for inputting the process variables may be any known device for entering data, such as a computer keyboard.

Figure 1:
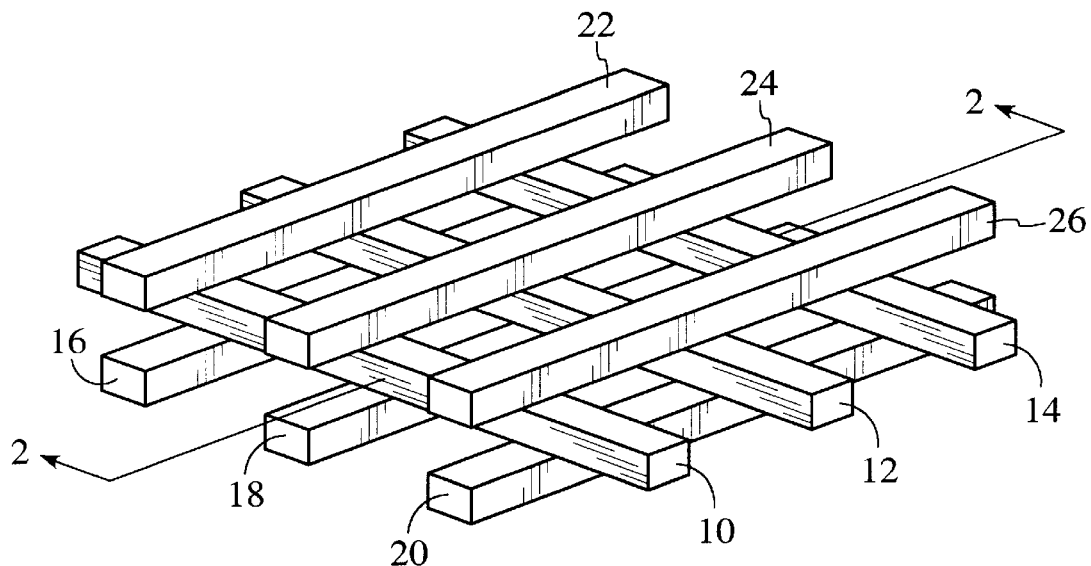
FIG. 1 is a perspective view of a three-layer interconnect structure in accordance with the prior art.
Figure 2:
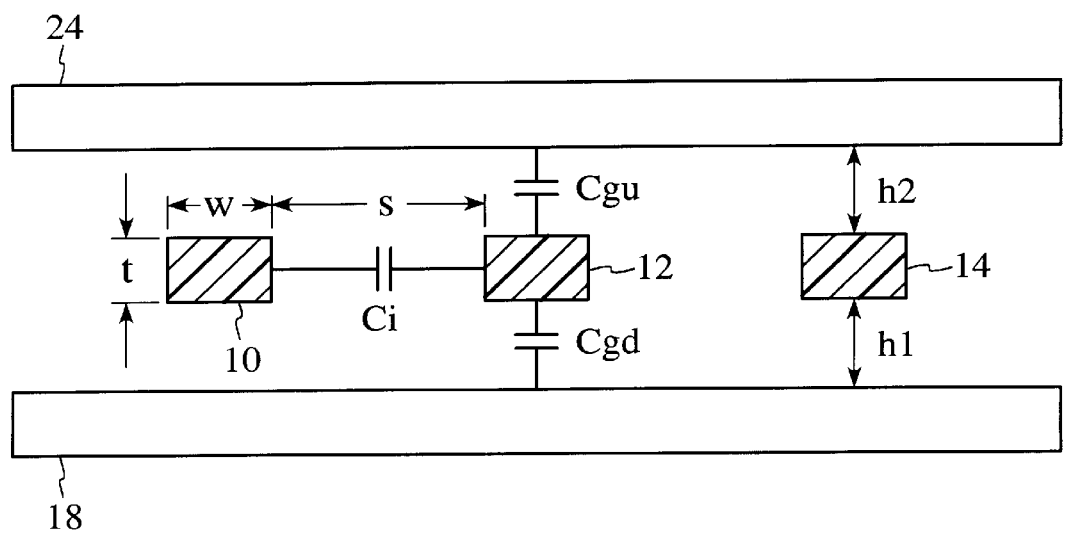
FIG. 2 is a side sectional view of the interconnect structure of FIG. 1, taken along lines 2—2.

Referring briefly to FIGS. 1 and 2, the process parameters may include the spacing (s) between adjacent interconnects 10, 12 and 14 in the active array, the thickness (t) and width (w) of the interconnects, and the thicknesses (h1 and h2) of the lower and upper dielectric layers. The process variables may be indirectly related to one of these parameters. For example, the process variable may be chemical metallization polishing (CMP) planarization, which causes significant variation in the interlayer dielectric thickness (i.e., h1 and h2) within a yield of integrated circuit chips. The geometrical variances are also input using device 26. A typical variance for the thickness parameter is in the range 5% to 30%. The variance for the parameter w is in the range of 10% to 30%.

In this first stage, the process variables are input into a HIVE generator 28, which provides 3-sigma values for resistance (R) and capacitance (C). A weighted root-sum square method may be utilized to output a table 30 of 3-sigma values. However, the 3-sigma R values may be more efficiently determined using Monte-Carlo based simulation.

The process variables from the input device 26 are also entered into a derivative HIVE generator 32 that outputs a derivative HIVE table 34. The derivative generator may be a derivative field solver for generation of capacitance derivatives with respect to geometries.

In a second phase, an input device 36 is used to enter a designed interconnect layout into a randomized RC generator 38. While the system 40 of FIG. 3 is shown as having three separate input devices 26, 36 and 42, a single input device may be used to provide the required data to the three generators 28, 32 and 38 and to a circuit simulator 44. In response to input of the interconnect layout, the randomized RC generator 38 accesses memory storage of the 3-sigma R and C table 30 and the derivative table 34. Randomized RC nets are output to memory 46. The memory 46 stores randomized, but correlated, R and C generated in a distributed 3-Pi network for the interconnect layout.

In the third phase, the input device 42 provides nominal or 3-sigma device modeling to the circuit simulator 44. SPICE or a delay/crosstalk calculator may be used to combine the device variations indicated from input 42 with the interconnect variations indicated from input from memory 46. The 3-sigma delay and 3-sigma crosstalk can be derived from a number of simulations. In one embodiment, a weighted root-sum square method may be used to combine the device and interconnect variations. Thus, an output 48 of the circuit simulator 44 is the 3-sigma delay and 3-sigma crosstalk values for the net list.

It has been determined that a more than 70% improvement in delay estimation is achieved as compared to traditional skew-corner, worst-case delay estimates. Furthermore, a practical approach is taken to estimating 3-sigma crosstalk. It also has been determined that a typical process corner for the dielectric thicknesses h1 and h2 is equal to the nominal dielectric thickness plus slightly more than 1-sigma of the dielectric thicknesses. A reliable estimation of 3-sigma crosstalk is then obtained relatively quickly for given layout and device parameters (e.g., interconnect width, interconnect spacing, coupled length, victim signal strength, and aggressor signal strength) of buses using the set of skewed interconnect parameters. This practical approach allows 3-sigma crosstalk estimations without running time-consuming Monte-Carlo based simulations.

GENERATING DERIVATIVES AND 3-SIGMA R AND C

As previously noted, FIG. 2 illustrates a two-dimensional interconnect cross section that identifies a number of the process variables that play a role in determining the delay and crosstalk within an interconnect structure. Another factor is the dielectric constant of the materials that separate the active array of interconnects 10, 12 and 14 from the lower interconnect 18 and the upper interconnect 24. Particularly for determining crosstalk, the lengths of the interconnects and the signal strengths of a victim interconnect and aggressor interconnects are relevant.

The process variables indicated in FIG. 2 have been determined to exhibit Gaussian distributions of geometrical variances. For purposes of the method to be described below it is assumed that the dielectric constants of interlayer dielectrics (ILD), the ILD thicknesses (h1 and h2), the interconnect thickness (t) and the interconnect (w) are mutually independent of each other. A second assumption is that higher order terms, such as quadratic derivatives or cross-derivative terms of R and C with respect to the process variables, are negligible compared to the linear terms of derivatives. This second assumption has been shown to be reasonable in view of extensive simulations. A third assumption is that the variation in the ILD dielectric constant is relatively small, so that it may be disregarded in the derivation of 3-sigma C. However, an adjustment of the method to include consideration of the dielectric constant would be easily accomplished.

The basis for the output function of the HIVE generator 28 of FIG. 3 begins with a Taylor series expansion on the function f (where f is capacitance or resistance) for which the variance is desired. Within the system 40, f is a function of $X=X_1, X_2, \ldots, X_n$ (material and process variables within the technological domain of process designers) and $Y=Y_1, Y_2, \ldots, Y_n$ (process variables within the circuit domain of circuit designers). By the Taylor series expansion on the function f, where $A1, \ldots An$, and $B_1, \ldots B_m$ are nominal values of X and Y, the following is obtained:

$$f(X, Y) = f(A_1, A_2, \ldots, A_n, B_1, B_2, \ldots, B_m) + \quad (1)$$

-continued $$\sum_{i=1}^{n} \frac{\partial f}{\partial X_i} \cdot (X_i - A_i) + \sum_{j=1}^{m} \frac{\partial f}{\partial Y_j} \cdot (Y_j - B_j) +$$

$$(1/2) \sum_{i=1}^{n} \frac{\partial^2 f}{\partial X_i^2} \cdot (X_i - A_i)^2 + (1/2) \sum_{j=1}^{m} \frac{\partial^2 f}{\partial Y_j^2} \cdot (Y_j - B_j)^2 +$$

$$(1/2) \sum_{i=1,j=1}^{n,m} \frac{\partial^2 f}{\partial X_i \partial Y_j} \cdot ((X_i - A_i) \cdot (Y_j - B_j)) + \ldots$$

In order to find the variance, use:

$$\mathrm{Var}(f) = E(f^2) - (E(f))^2 \qquad (2)$$

where $E(f^2)$ and $E(f)$ are the expected values of $f^2$ and $f$. It therefore follows that:

$$\mathrm{Var}(f) = f^2(A_1, A_2, \ldots, A_n, B_1, B_2, \ldots, B_m) + \qquad (3)$$

$$E\left[\left(\sum_{i=1}^{n} \frac{\partial f}{\partial X_i} \cdot (X_i - A_i)\right)^2\right] + E\left[\left(\sum_{j=1}^{m} \frac{\partial f}{\partial Y_j} \cdot (Y_j - B_j)\right)^2\right] +$$

$$2\left(E\left[\left(\sum_{i=1}^{n} \frac{\partial f}{\partial X_j} \cdot (X_i - A_j)\right) \cdot \left(\sum_{j=1}^{m} \frac{\partial f}{\partial Y_j} \cdot (Y_j - B_j)\right)\right]\right) +$$

(2nd order and above terms of $E(f^2)$) −

$$((E[(f(A_i, A_2, \ldots A_n, B_1, B_2, \ldots, B_m)])^2 -$$

(2nd order and above terms of $(E(F))^2$)

According to the assumptions above, the function f (i.e., the capacitance or resistance) depends mainly on the technological domain process variables h1, h2 and t, as well as the circuit domain process variables w and s, as shown in FIG. 2. However, w and s can theoretically vary from their minimums to any arbitrarily large values. Consequently, the variance of capacitance and resistance can be generated such that for each interconnect model that consists of h1, h2, t, w and s (or "pitch" as the sum of w and s), and for each combination of w and s (or pitch) from Equation (3) the following is derived:

$$\mathrm{Var}(f(h_1, h_2, t, w)) \cong \left(\frac{\partial}{\partial X_1} f(h_1, h_2, t, w)\right)^2 \cdot E((X_1 - h_1)^2) + \qquad (4)$$

$$\left(\frac{\partial}{\partial X_2} f(h_1, h_2, t, w)\right)^2 \cdot E((X_2 - h_2)^2) +$$

$$\left(\frac{\partial}{\partial X_3} f(h_1, h_2, t, w)\right)^2 \cdot E((X_3 - t)^2) +$$

$$\left(\frac{\partial}{\partial Y_1} f(h_1, h_2, t, w)\right)^2 \cdot E((Y_1 - w)^2) +$$

$$E\left[\left(\sum_{i=1}^{n} \frac{\partial^2}{\partial X_i^2} f(h_1, h_2, t, w) \cdot \left(\frac{(X_i - A_i)^2}{2!}\right)\right)^2\right] +$$

$$E\left[\left(\sum_{j=1}^{m} \frac{\partial^2}{\partial Y_j^2} f(h_1, h_2, t, w) \cdot \left(\frac{(Y_j - B_j)^2}{2!}\right)\right)^2\right] +$$

$$\left(E\left[\sum_{i=1}^{n} \frac{\partial^2}{\partial X_i^2} f(h_1, h_2, t, w) \cdot \left(\frac{(X_i - A_i)^2}{2!}\right)\right]\right)^2 +$$

$$\left(E\left[\sum_{j=1}^{m} \frac{\partial^2}{\partial Y_j^2} f(h_1, h_2, t, w) \cdot \left(\frac{(Y_j - B_j)^2}{2!}\right)\right]\right)^2 +$$

$$2\left(E\left[\sum_{j=1,i\neq j}^{n,n} \frac{\partial}{\partial X_i} f(h_1, h_2, t, w) \cdot (X_i - A_i) \cdot \right.\right.$$

$$\left.\left. \frac{\partial}{\partial X_j} f(h_1, h_2, t, w) \cdot (X_j - A_j)\right]\right) +$$

$$2\left(E\left[\sum_{j=1,i\neq j}^{m,m} \frac{\partial}{\partial Y_i} f(h_1, h_2, t, w) \cdot (Y_i - B_i) \cdot \frac{\partial}{\partial Y} f(h_1, h_2, t, w) \cdot \right.\right.$$

$$\left.\left. (Y_j - B_j)\right]\right) +$$

$$\left(E\left[\left(\sum_{i=1}^{n} \frac{\partial}{\partial X_i} f(h_1, h_2, t, w) \cdot (X_i - A_i)\right) \cdot \right.\right.$$

$$\left.\left. \left(\sum_{j=1}^{m} \frac{\partial}{\partial Y_j} f(h_1, h_2, t, w)(Y_j - B_j)\right)\right]\right)$$

where $h_1$, $h_2$ t and w are nominal values, while the corresponding variables are designated by $X_1$, $X_2$, $X_3$ and $Y_1$ in the equation. Moreover, in the preferred embodiment, n=3 and m=1, but the number of the variables (n and m) can be changed.

In this derivation, the derivative is the same for all of the dielectric layers that constitute h1. As an example, there may be five dielectric layers that form the ILD having a thickness of h1. Since the derivative is the same for all of the dielectric layers, $\sigma_{x_1}^2$ can be used to represent the composite. The same is true for the ILD thickness h2, because the dielectrics that comprise h2 are likewise independent of each other.

Furthermore, since s=pitch − w, and pitch is treated as a constant for a given interconnect model with layout parameters w and s, the variance caused by s is considered merely by including the w variation. This simplifies equation (4), but a person skilled in the art can easily add the s variation.

As previously noted, it is assumed that all of the process variables are independent. As a result, the final three terms in equation (4) can be disregarded. Additionally, from simulation results, it has been determined that the second derivatives are very small compared to the first derivative of the function f to X or Y parameters. It follows that we can ignore terms containing either $$\sum_{i=1}^{n} \cdot \frac{\partial^2}{\partial X_i^2} f(h_1, h_2, t, w) \cdot \left(\frac{(X_i - A_i)^2}{2!}\right)$$

or $$\sum_{j=1}^{m} \frac{\partial^2}{\partial Y_j^2} f(h_1, h_2, t, w) \cdot \left(\frac{(Y_j - B_j)^2}{2!}\right)$$

The variance function for given process variables then becomes:

$$\left(\frac{\partial}{\partial X_1}f(h_1,h_2,t,w)\right)^2 \cdot \sigma_{X_1}^2 + \left(\frac{\partial}{\partial X_2}f(h_1,h_2,t,w)\right)^2 \cdot \sigma_{X_2}^2 + \quad (5)$$

$$\left(\frac{\partial}{\partial X_3}f(h_1,h_2,t,w)\right)^2 \cdot \sigma_{X_3}^2 + \left(\frac{\partial}{\partial Y_1}f(h_1,h_2,t,w)\right)^2 \cdot \sigma_{Y_1}^2$$

If there are other process parameters that become significant for the final variance of R and/or C in the future deep-submicron integrated circuit chip technologies, the relevant terms may be added to the variance formula. Equation (5) is general, but not limited to the current technology.

Since intralayer capacitive coupling (Ci) and interlayer capacitive coupling (Cgd and Cgu) are functions of h1, h2, t, w and pitch, the variance of each capacitance can be derived following the method outlined above. Still assuming that h1, h2, t and w are mutually independent of each other and that w+s=pitch, total capacitance (Ctotal) may be determined as:

$$\text{Var}(C\text{total}) = \text{Var}(2^*Ci + Cgd + Cgu) \quad (6)$$

$$\text{Var}(C\text{total}) = 4^*\text{Var}(Ci) + \text{Var}(Cgd) + \text{Var}(Cgu) + 2^*\text{Cov}(Ci,Cgd) + 2^*\text{Cov}(Ci,Cgu) + 2^*\text{Cov}(Cgd,Cgu) \quad (7)$$

Based upon simulations the covariance (Cov) terms above are typically negative, since Ci, Cgd and Cgu compete for the electromagnetic lines. Furthermore, the covariance terms are significantly smaller than the sum of 4*Var(Ci), Var(Cgd), and Var(Cgu). A conservative estimate of Var(Ctotal) can be obtained by ignoring the covariance terms. Therefore, $$\text{Var}(C\text{total}) = \text{Var}(2^*Ci+Cgd+Cgu) = 4^*\text{Var}(Ci)+\text{Var}(Cgd)+\text{Var}(Cgu) \quad (8)$$

The 3-sigma C values for the HIVE table at memory 30 can be derived from the following formulas:

$$Ci\_\max = Ci\_\text{nom} + 3^*\sigma_{C_i} \quad (9)$$

$$Ci\_\min = Ci\_\text{nom} - 3^*\sigma_{C_i} \quad (10)$$

$$Cgd\_\max = Cgd\_\text{nom} + 3^*\sigma_{C_{gd}} \quad (11)$$

$$Cgd\_\min = Cgd\_\text{nom} - 3^*\sigma_{C_{gd}} \quad (12)$$

$$Cgu\_\max = Ci\_\text{nom} + 3^*\sigma_{C_{gu}} \quad (13)$$

$$Cgu\_\min = Cgu\_\text{nom} - 3^*\sigma_{C_{gu}} \quad (14)$$

$$C\text{total}\_\max = 2^*Ci\_\text{nom} + Cgd\_\text{nom} + Cgu\_\text{nom} + 3^*\sigma_{C_{total}} \quad (15)$$

$$C\text{total}\_\min = 2^*Ci\_\text{nom} + Cgd\_\text{nom} + Cgu\_\text{nom} - 3^*\sigma_{C_{total}} \quad (16)$$

Generically, the 3-sigma capacitance values may be identified as:

$$C_{3\sigma} = C_{nom} \pm (3 \cdot \sqrt{\text{Var}(c)})$$

The capacitance values may be computed using FCAP2 and FCAP3 algorithms, which are known in the art and available in commercial C language libraries for numerical simulation. Capacitance is a nonlinear function of interline spacing (s) between interconnects and interconnect width (w) within the same metal layer. Similarly, the capacitance derivative is a nonlinear function of s and of w. A goal in determining the capacitance table in memory 30 and the derivative table in memory 34 of FIG. 3 is to construct a database of presimulated capacitance and capacitance derivative at the minimum sampling grid points defined by w and s, so that during an interactive layout design phase, the capacitance and capacitance derivative of an arbitrarily chosen width and spacing can be interpolated in real time using bi-cubic spline interpolation. The method for selecting the minimum number of sampling points with regard to the interline spacing or trace width dimensions will be described below in a section entitled "Adaptive Sampling Algorithm for Selecting Spacing and Width."

Regarding 3-sigma values for resistance, the same method may be utilized to complete the 3-sigma table in memory 30 of FIG. 3. However, a Monte-Carlo based simulation may be used to generate $R_{3\sigma}$. Per-unit resistance is equal to sheet resistivity ($\rho_{sheet}$) divided by the interconnect width (w). The variance formula is:

$$\text{Var}(R) = \text{Var}(\rho_{sheet}/w)$$

The Gaussian distributions of $\rho_{sheet}$ and w are known in general. Therefore, Monte-Carlo based simulation may be used to generate $R_{3\sigma}$ in a manner that is less computationally demanding than the weighted root-sum square method used to derive $C_{3\sigma}$.

GENERATING RANDOMIZED RC NETS

Applying the derivation of Equation (1), capacitance and resistance can be approximated using Taylor series expansion. It is assumed that the higher order terms (i.e., above first order) are negligible. The randomized capacitance and resistance values acquired by means of the randomized RC generator 38 of FIG. 3 can be obtained from the following linear approximation:

$$f(X,Y) \cong f(A_1, A_2, \ldots, A_n, B_1, B_2, \ldots B_m) + \sum_{i=1}^{n} \frac{\partial f}{\partial X_i} \cdot (X_i - A_i) + \sum_{j=1}^{m} \frac{\partial f}{\partial Y_j} \cdot (Y_j - B_j) \quad (17)$$

Specifically, a randomized capacitance can be obtained from the following equation:

$$C(h_1^*, h_2^*, t^*, w^*) = C(h_1, h_2, t, w) + \frac{\partial}{\partial h_1^*}C(h_1, h_2, t, w) + \frac{\partial}{\partial h_2^*}C(h_1, h_2, t, w) + \frac{\partial}{\partial t^*}C(h_1, h_2, t, w) + \frac{\partial}{\partial w^*}C(h_1, h_2, t, w)$$

where $h_1$, $h_2$, t and w are nominal values for the interconnect layout input by means of the input device 36, and where $h1^*$, $h2^*$, $t^*$ and $w^*$ are Gaussian randomly generated parameters that respectively represent $X_1$, $X_2$, $X_3$ and $Y_1$, of Equation (4) and Equation (5). As explained above, a fixed pitch is assumed, so that no term for spacing s is necessary. However, if the pitch is not fixed, the term s may be included in the calculation without diverting from the invention.

The randomized per-unit resistance can be derived from the following linear approximation:

$$R \cong R_{nom} + \frac{\partial R}{\partial \rho^*} \cdot (\rho^* - \rho_{nom}) + \frac{\partial R}{\partial t^*} \cdot (t^* - t_{nom}) + \frac{\partial R}{\partial w} \cdot (w^* - w_{nom})$$

Since the nominal and 3-sigma values of $\rho_{sheet}$ and t are known, the distribution of $\rho$ (i.e., resistivity) can be derived. In addition, the Gaussian randomly generated parameters $h_1^*$, $h_2^*$, $t^*$ and $w^*$ from the randomized C calculation are used to generate randomized per-unit R, since they are relevant to the same interconnect layout input using device 36 of FIG. 3.

The process for generating the distributed RC nets may be implemented using various techniques. In one embodiment, the randomized parameters are obtained using Gaussian Monte-Carlo generation. Spline interpretation based upon the HIVE database of memory 30 may be used to generate $f(A_1, A_2, \ldots, A_n, B_1, B_2, \ldots, B_m)$. Bi-cubic spline interpolation based upon the derivative database of memory 34 may be used to generate both $$\sum_{i=1}^{n} \frac{\partial f}{\partial X_i} \cdot (X_i - A_i)$$

and $$\sum_{j=1}^{m} \frac{\partial f}{\partial Y_j} \cdot (Y_j - B_j)$$

To summarize, the original Taylor series expansion of R and C, along with randomized but correlated R and C, can be generated from nominal R and C and partial derivatives of R and C with respect to process parameters given the Gaussian randomly generated input parameters h1, h2, t and w. When the randomized by correlated R and C values are combined with a nominal/3-signal device model from input device 42, 3-sigma delay can be derived from a number of simulations via SPICE or fast delay calculator. The reliability of the estimations can be increased by increasing the number of simulations.

COMBINING INTERCONNECT AND DEVICE MODELING

In FIG. 3, the device modeling from the input 42 is combined with the minimized RC net list from memory 46 to provide statistical circuit simulation. In one embodiment, the method uses weighted root-sum square techniques to combine the device and interconnect variations. This approach is reasonable, since the device and interconnect variations arise independently in front-half and back-half processes. The total variance of a critical path delay due to the device and interconnect variations can be found from these circuit simulations; one with nominal device and interconnect models, one with 3-sigma device and nominal interconnect models, and one with nominal device and 3-sigma interconnect models. The critical path delay variance may be determined by:

Var(Critical_path)=Var(Device)+Var(Interconnect)+Cov(Device, Interconnect)

Assuming Cov(Device, Interconnect) is small and usually negative:

Var(critical path)≈Var(device)+Var(Interconnect)  (20)

OBTAINING 3-SIGMA DELAY

There are two methods of obtaining total delay for a critical path. The first method is to use the nominal device modeling from input 42 and nominal interconnect for circuit simulation, and the 3-sigma device modeling and nominal interconnect for circuit simulation. From Equation 20, it is determined that:

$$\text{Delay(critical path)} \approx \left(\frac{\partial}{\partial Dev}\text{Delay}\right)^2 \cdot \sigma_{Dev}^2 + \left(\frac{\partial}{\partial Int}\text{Delay}\right)^2 \cdot \sigma_{Int}^2 = \quad (21)$$

$$(\text{Delay}(Dev_{3-sigma}, Int_{nom}) - \text{Delay}(Dev_{nom}, Int_{nom}))/3 +$$

$$(\text{Delay}(Dev_{nom}, Int_{randomized}) - \text{Delay}(Dev_{nom}, Int_{nom}))/3$$

where Delay($Dev_{nom}$, $Int_{randomized}$) refers to the 3-sigma delay using nominal device and randomized RC simulations via Monte-Carlo techniques. Similarly, the crosstalk for a critical path can be derived in this manner.

The second method is to generate a randomized device model and a randomized RC model together for circuit simulation. Since the process variables for devices and interconnects are independent of each other for deep-submicron integrated circuit chip technologies, the combination of the randomized models and the simulation run provides reliable results. With three hundred simulation runs for different randomized devices and interconnects, for example, it is possible to extract a 3-sigma delay from the three hundred samples of delay results with an uncertainty of only 5.8%. For Monte-Carlo simulation theory, uncertainty is identified as being proportional to $1/\sqrt{\text{number of simulations}}$, so that $1/\sqrt{300}=5.8\%$.) Methods for generating a randomized device model are known in the art, and will not be described.

Figure 4:
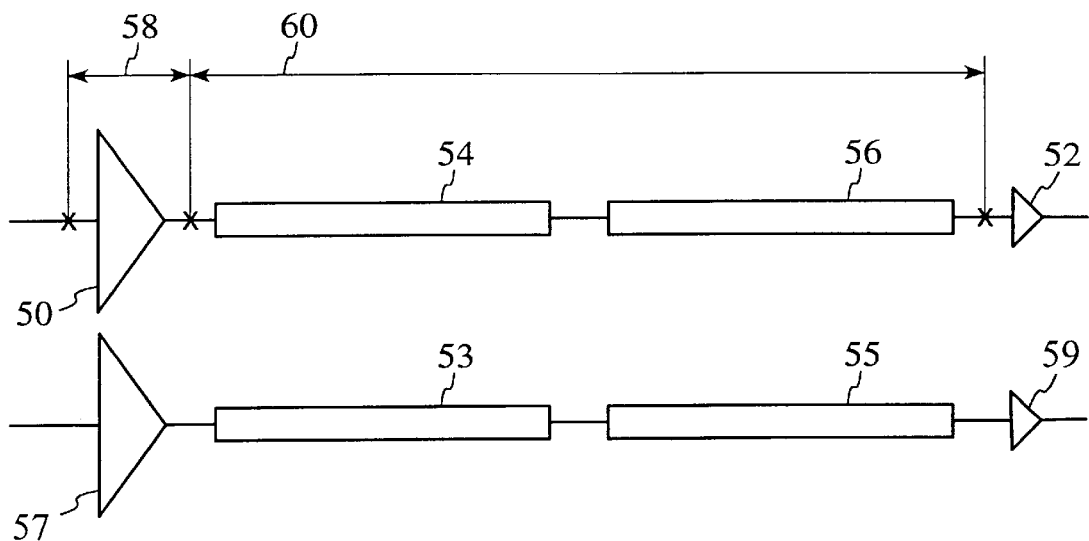
FIG. 4 is a schematical representation of a critical net for which delay and crosstalk with a parallel net are to be determined.

FIG. 4 illustrates a long critical net with inverters 50 and 52 as input drivers and output receivers, respectively, and with two cascaded interconnect models 54 and 56. The first interconnect 54 has an active metal 2 on top of dense metal 1 and under dense metal 3 (i.e., m2_m1_m3). This first interconnect model is a distributed 3-Pi RC network for which w=1 μm, s=1 μm, and length=3000 μm. The second interconnect 56 includes an active metal 3 on top of metal 1 and under dense metal 4 (i.e., m3_m1_m4). This interconnect is a distributed 3-Pi RC network in which w=0.5 μm, s=0.8 μm, and length=3000 μm.

The interconnect models 54 and 56 may be considered as victim interconnects for purposes of considering crosstalk, which will be the focus in the next section. The aggressor interconnects are illustrated as cascaded interconnect models 53 and 55 of an electrically parallel path that includes input and output inverters 57 and 59.

Figure 5:
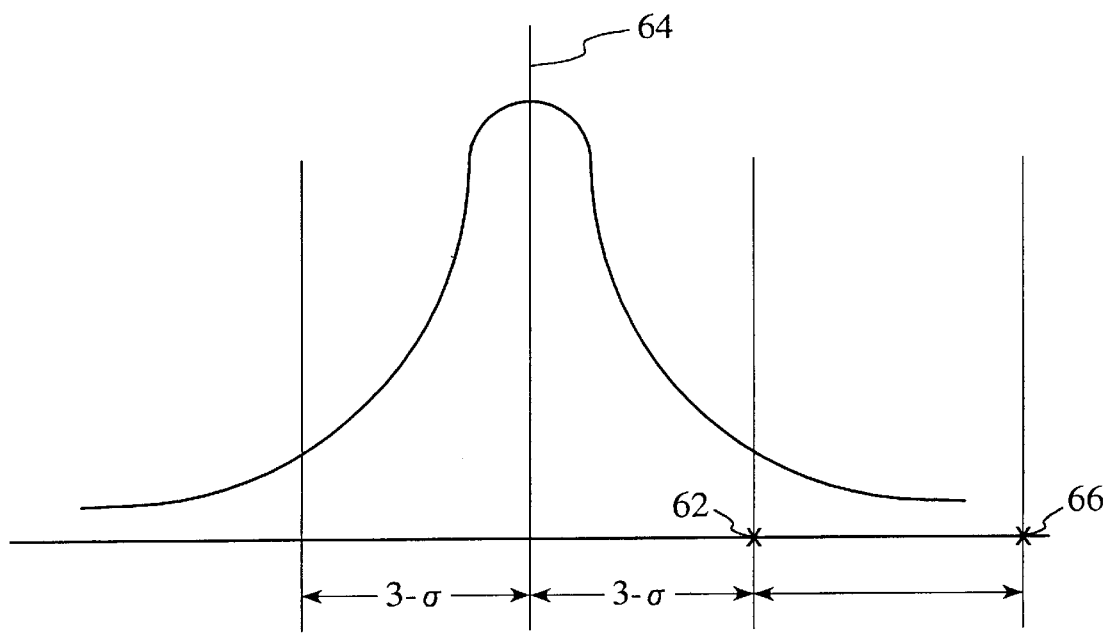
FIG. 5 is a graphical representation of a delay profile for the critical net of FIG. 4.

The device delay of concern for the long critical net of FIG. 4 is schematically represented by double-arrowed indicator 58, while the interconnect delay of concern is represented by double-arrowed indicator 60. FIG. 5 is a graphical comparison of the determination of the maximum 3-sigma value generated according to the method above and the traditional skew-corner maximum worst-case value generated in accordance with the prior art. The 3-sigma value at 62 is significantly closer to the nominal value 64 than the skew-corner value 66. Three hundred samples were used to achieve a 5.8% uncertainty in accuracy. The nominal delay for a combination of device delay 58 and interconnect day 60 was determined to be 501.5 ps. The traditional skew-corner method for determining worst-case delay in the critical net of FIG. 4 resulted in a delay estimation of 669.6 ps. In comparison, the statistically based method described with reference to FIG. 3 provided an estimate of 540.2 ps from Equation (21) when using 3-sigma device modeling from input 42 and a randomized RC net list from memory 46. This is an improvement of 77% in the delay estimation {i.e., (skew-corner value−3-sigma value)/(skew-corner value−nominal value)=(669.6 ps−540.2 ps)/(669.6 ps−501.5 ps)=77%}. Moreover, the delay uncertainty decreased from 33.5% in the skew-corner worst-case determination to 7.8% in the 3-sigma worst-case determination.

OBTAINING 3-SIGMA CROSSTALK AND DELAY

Determinations of 3-sigma crosstalk can be obtained using the randomized RC generation technique on the distributed RC net list from memory 46 in FIG. 3. The crosstalk values are acquired for generally parallel interconnects, such as those found in buses. As previously described, interconnect models 54 and 56 of FIG. 4 are "victim" interconnects with respect to signals conducted along "aggressor" interconnects 53 and 55.

Monte-Carlo based simulation techniques for predicting crosstalk require hundreds of simulations and are often too time-consuming to meet interactive requirements for designers. A less time-consuming method is to generate a crosstalk/delay HIVE database that is based upon identifying typical process corners for w, t, h1 and h2. As an equivalent to identifying the typical process corners for the four process variables, a set of $k_1$, $k_2$, $k_3$ and $k_4$ in the equations below may be found to provide 3-sigma crosstalk estimations over a wide range of widths, spacings, coupling lengths and victim/aggressor signal strengths.

$$w = w_{nom} + k_1 \sigma_w$$
$$t = t_{nom} + k_2 \sigma_t$$
$$h1 = h1_{nom} + k_3 \sigma_{h1}$$
$$h2 = h2_{nom} + k_4 \sigma_{h2}$$

where $k_1$, $k_2$, $k_3$ and $k_4$ are between $-3$ and $+3$. The values for $k_1$, $k_2$, $k_3$ and $k_4$ can be different for different process technologies. One acceptable method of determining $k_1$, $k_2$, $k_3$ and $k_4$ is to first heuristically set $k_1$ and $k_2$ at fixed values and then set $k_3$ to be equal to $k_4$. A binary search algorithm can then be employed to find $k_3$ and $k_4$ such that the worst-case values of crosstalk and delay defined by $k_1$, $k_2$, $k_3$ and $k_4$ match the worst-case value from value from Monte-Carlo simulations.

Optionally, the method can be further simplified by setting the width and thickness of the interconnects to be the maximum values under manufacturing variations, since the worst-case crosstalk occurs when there is maximum coupling on neighboring signals. By setting w and t to the maximum values, the method allows the process corners for h1 and h2 for a particular interconnect structure to be determined by matching the 3-sigma crosstalk found during Monte-Carlo based simulation. In one process technology, the typical process corner for h1 and h2 was determined to be equal to the nominal dielectric thickness plus slightly greater than 1-sigma of the dielectric thickness. This practical approach of using skewed interconnect parameters enables quick 3-sigma crosstalk estimation for given process variables and other relevant parameters (i.e., width, spacing, coupling length, victim signal strength and aggressor signal strength). The practical approach enables estimates of 3-sigma crosstalk of coupled signal nets during design or post-layout verification without requiring time consuming Monte-Carlo based simulations.

A crosstalk/delay HIVE database can be generated based upon process corners identified by matching 3-sigma crosstalk/delay from the randomized RC net generation of table 46 in FIG. 3 and using Taylor series approximations. Storing the table that is based upon process corners enables subsequent use for estimating 3-sigma crosstalk on a net-by-net basis over a wide range of parameters.

While the invention has been described and illustrated with reference to an integrated circuit chip, the method and system for determining electrical characteristics may be used in other applications, such as the design of printed circuit boards and multi-chip modules.

ADAPTIVE SAMPLING ALGORITHM FOR SELECTING SPACING AND WIDTH

As noted above toward the end of the section entitled "Generating Derivatives and 3-Sigma R and C," the capacitance values and the capacitance derivatives for forming the memory tables 30 and 34 in FIG. 3 are nonlinear functions of interline spacing (s) and trace width (w). Consequently, in order to construct a database of presimulated capacitances and capacitance derivatives, the number of sampling grid points must be defined for w and s, so that during the interactive design phase, the capacitance and capacitance derivative of an arbitrarily chosen w and s can be interpreted in real-time using bi-cubic spline interpolation. The method of selecting the minimum number of sampling points in the s or w dimension will now be described.

The sampling point selection algorithm begins with a first step of designating three sampling points, one at the minimum spacing/width, a second at the midpoint of the total spacing/width range, and the third at the maximum spacing/width. In a second step, a field solver is used to obtain all of the capacitances and capacitance derivatives of concern. Referring again to FIG. 2, the capacitances of concern are the intralayer capacitance coupling of Ci and the interlayer capacitance couplings of Cgd and Cgu. The capacitance derivatives of interest are dCi/dt, dCi/dh1, dCi/dh2, dCi/dw, dCgd/dt, dCgd/dh1, dCgd/dh2, dCgd/dw, dCgu/dt, dCgu/dh1, dCgu/dh2, and dCgu/dw.

In the third step, for each capacitance and each capacitance derivative, the following substeps are executed:

(a) Calculate the derivative of each subregion formed by two consecutive sampling points in the width/spacing dimension.

(b) Sort the derivatives of the subregions by the absolute magnitudes of the derivatives.

(c) Starting with the subregion with the largest absolute magnitude in its derivative by two sampling points in the subregion, perform the following:

(1) Run the cubic-spline modeling for all of the sampling points considered thus far, and use the modeling to interpolate the capacitance or capacitance derivative at the middle spacing/width between two of the defined spacing/width points.

(2) Use the field solver to calculate the capacitance or capacitance derivative at the same intermediate point.

(3) Compare the two capacitances or capacitance derivatives. If the two values match within a predetermined range (e.g., ±2%), return to the substep (c) of running the cubic-spline modeling, but consider the next subregion in executing the substep. When it is determined that there is a match within the predefined range for all of the subregions, the minimum number of sampling points for the spacing/width dimension is determined to have been found. On the other hand, if two capacitances or capacitance derivatives do not match within the predefined range, the process continues to substep (d) below.

(d) If the cubic-spline modeling interpolated and field-solver calculated two capacitances or two capacitance derivatives that do not match within the predefined range, the current spline fit is deemed to be inadequate. As a correction, a new middle spacing/width sampling point is added at the current intermediate point in which the two capacitances or two capacitance derivatives were calculated for the mismatch. Since the cubic-spline modeling of substep (a) will need to be rebuilt from the beginning, it is necessary to return to the beginning of step three, using the increased number of sampling points.

This three-step process with the numerous substeps of step three is not critical to the invention. Other methods may be utilized in selecting the sampling grid points defined by w and s. However, the adaptive sampling algorithm has been determined to operate well for its intended purpose.

What is claimed is:

1. A method of determining circuit performance-related characteristics of interconnects comprising steps of:

defining a plurality of process variables which affect geometries of interconnect structures such that at least one of capacitances and resistances of said interconnect structures are affected;

generating statistically based worst-case values representative of capacitances imposed by said geometries of said interconnect structures, said worst-case values representative of capacitances being associated with selections of said process variables;

generating statistically based worst-case values representative of resistances imposed by said geometries of said interconnect structures, said worst-case values representative of resistances being associated with said selections of said process variables;

generating capacitance derivatives with respect to said geometries of said interconnect structures;

selecting an interconnect layout based upon selected said process variables for fabricating a desired circuit;

generating a plurality of resistance-capacitance (RC) nets representative of said interconnect layout such that resistance and capacitance are correlated for each RC net and are partially determined by a randomized selection of values for geometries of said interconnect layout, the generation of each RC net including utilizing said capacitance derivatives and said worst-case values representative of capacitances and resistances; and determining a worst-case measure of a circuit performance-related characteristic of interest for said interconnect layout based upon said RC nets.

2. The method of claim 1 wherein said steps of generating said statistically based worst-case values representative of capacitances and resistances are steps of defining 3-sigma values.

3. The method of claim 1 wherein said step of generating said statistically based worst-case values representative of capacitances includes storing a first table having 3-sigma values for interlayer capacitive coupling and intralayer capacitive coupling for each of a plurality of interconnect structures that are distinguishable with respect to selections of said process variables.

4. The method of claim 3 wherein said step of defining said process variables includes identifying technology domain variables and circuit domain variables, said technology domain variables including planarization processes, said circuit domain variables including interconnect thicknesses, lengths and widths, each of said process variables having a Gaussian variance distribution in fabricating interconnect structures.

5. The method of claim 3 wherein said step of generating said capacitance derivatives includes storing a second table of partial derivatives with respect to specific interconnect geometries.

6. The method of claim 5 wherein said step of generating said RC nets further includes utilizing bi-cubic spline interpolation with said first and second tables to determine said RC nets and said 3-sigma values for capacitive coupling.

7. The method of claim 1 wherein said step of generating said RC nets includes determining, on a net-by-net basis, differences between nominal values and said randomized values for said geometries of said interconnect layout, said RC net generation step further including correlating resistances and capacitances in forming said RC nets by correlating uses of said randomized values.

8. The method of claim 1 wherein said step of determining said worst-case measure of said circuit performance-related characteristics of interest includes executing circuit simulations based upon said RC nets for said interconnect layout and based upon a device model for device circuitry to be connected via said interconnect layout, said circuit performance-related characteristic of interest being one of delay and crosstalk.

9. The method of claim 8 wherein said step of determining said worst-case measure includes generating 3-sigma values for each of said delay and said crosstalk.

10. The method of claim 9 wherein said 3-sigma values for delay are acquired using a weighted root sum square approach and said 3-sigma values for crosstalk are based on determining process corners for a plurality of said process variables.

11. The method of claim 10 wherein said step of generating said 3-sigma values for crosstalk includes skewing at least some of said process variables to identify said process corners.

12. A method of determining delay associated with interconnected semiconductor circuitry comprising steps of:

designating interconnect process variables for which each has a generally Gaussian distribution of geometrical variances when utilizing interconnect fabrication techniques, said process variables including a range of thicknesses of a first interconnect layer and a range of thicknesses of dielectric material between two interconnect layers;

storing a first and second table of 3-sigma values for resistances and capacitances for a plurality of combinations of said interconnect process variables, said 3-sigma values for resistances and capacitances being statistically based worst-case values;

storing a third table of partial derivatives of capacitance with respect to said interconnect process variables;

selecting an interconnect layout for interconnecting devices of said semiconductor circuitry, including specifying geometrical values for said interconnect process variables;

generating distributed RC nets representative of said interconnect layout based upon said first and second tables of 3-sigma values of said resistances and capacitances and based upon said third table of partial derivatives; and acquiring a 3-sigma estimate of delay for said interconnect layout based upon said RC nets.

13. The method of claim 12 wherein said step of acquiring said 3-sigma estimate of delay includes inputting either a nominal or 3-sigma device model to provide data indicative of device delay.

14. The method of claim 12 further comprising a step of estimating 3-sigma crosstalk for said interconnect layout partially based upon said RC nets.

15. A system for determining circuit performance-related characteristics of interconnects comprising:

first generator means for outputting 3-sigma values of capacitances and 3-sigma values of resistances in response to inputting identifications of interconnect process variables having Gaussian distributions of geometrical variances for interconnect fabrication, said 3-sigma values of capacitances and resistances being statistically based worst-case values;

second generator means for outputting partial derivatives of capacitances in response to said inputting said identifications of said interconnect process variables;

a randomized RC generator means having access to said 3-sigma values of capacitances and resistances and having access to said partial derivatives of capacitances for outputting randomized RC netlists in response to input of an interconnect layout having specified values for said interconnect process variables; and a circuit simulator having access to said randomized RC netlists for outputting 3-sigma values of delay for said interconnect layout.

16. The system of claim 15 wherein said first and second generator means are HIVE generators.

17. The system of claim 15 wherein said circuit simulator is one of a SPICE simulator and a delay calculator.

18. The system of claim 15 further comprising a device model generator connected to said circuit simulator to enable estimation of 3-sigma values of delay and crosstalk for a critical path a semiconductor circuit having said interconnect layout.

19. The system of claim 18 wherein said device model generator includes means for determining process corners for said interconnect process variables such that said estimation of said 3-sigma values of crosstalk is enabled.

* * * * *